(12) United States Patent  
Yoshida et al.

(10) Patent No.: US 8,231,324 B2  
(45) Date of Patent: Jul. 31, 2012

(54) ARTICLE STORAGE FACILITY

(75) Inventors: Mitsuru Yoshida, Higashiomi (JP); Yoshitaka Inui, Omihachiman (JP)

(73) Assignee: Daifuku Co., Ltd., Osaka (JP)

( * ) Notice: Subject to any disclaimer, the term of this patent is extended or adjusted under 35 U.S.C. 154(b) by 1155 days.

(21) Appl. No.: 12/041,991

(22) Filed: Mar. 4, 2008

(65) Prior Publication Data

US 2009/0016864 A1    Jan. 15, 2009

(30) Foreign Application Priority Data

Mar. 7, 2007    (JP) .................... 2007-057210

(51) Int. Cl.
*B65G 1/00*    (2006.01)
(52) U.S. Cl. .................... 414/280; 414/626; 414/688
(58) Field of Classification Search .................... 414/280, 414/626, 688, 785
See application file for complete search history.

(56) References Cited

U.S. PATENT DOCUMENTS

| | | | |
|---|---|---|---|
| 3,954,185 A | 5/1976 | Wentz | |
| 5,741,109 A | 4/1998 | Wiesler et al. | |
| 7,165,927 B2 | 1/2007 | Doherty et al. | |
| 7,972,104 B2 * | 7/2011 | Shiwaku et al. | 414/282 |
| 2001/0014268 A1 | 8/2001 | Bryson, III et al. | |
| 2004/0109746 A1 * | 6/2004 | Suzuki | 414/373 |
| 2004/0126208 A1 | 7/2004 | Tawyer et al. | |
| 2006/0245862 A1 | 11/2006 | Hansl et al. | |
| 2007/0059131 A1 | 3/2007 | Yoshitaka | |

FOREIGN PATENT DOCUMENTS

| | | |
|---|---|---|
| DE | 1602895 B2 | 6/1971 |
| DE | 2102098 | 7/1972 |
| DE | 8400348 U1 | 8/1984 |
| DE | 3509678 A1 | 9/1986 |
| DE | 3531444 A1 | 2/1987 |
| DE | 102006036095 A1 | 3/2007 |
| EP | 0116152 A2 | 8/1984 |
| EP | 1547943 A1 | 6/2005 |
| EP | 1707507 A1 | 10/2006 |
| FR | 2711629 A1 | 5/1995 |
| GB | 1202361 | 6/1973 |
| JP | 60122604 A | 7/1985 |
| JP | 2135513 | 9/1990 |
| JP | 2004189018 A | 7/2004 |
| WO | 2004034438 A2 | 4/2004 |

* cited by examiner

*Primary Examiner* — Saul Rodriguez
*Assistant Examiner* — Willie Berry, Jr.
(74) *Attorney, Agent, or Firm* — The Webb Law Firm

(57) ABSTRACT

The article storage facility comprises an article transporter configured to move along a path via an article transfer location with respect to an article storage rack; an article loader for bringing articles into and taking articles out of the article storage rack, provided to the article storage rack so as to project and retract between a protruding position for article receipt that projects to an outside of the article storage rack, and a retracted position for retracting toward the article storage rack; and a protrusion and retraction operating device provided to the article transporter, for causing the article loader to protrude and retract between the protruding position and the retracted position when the article transporter is at the article transfer location.

20 Claims, 14 Drawing Sheets

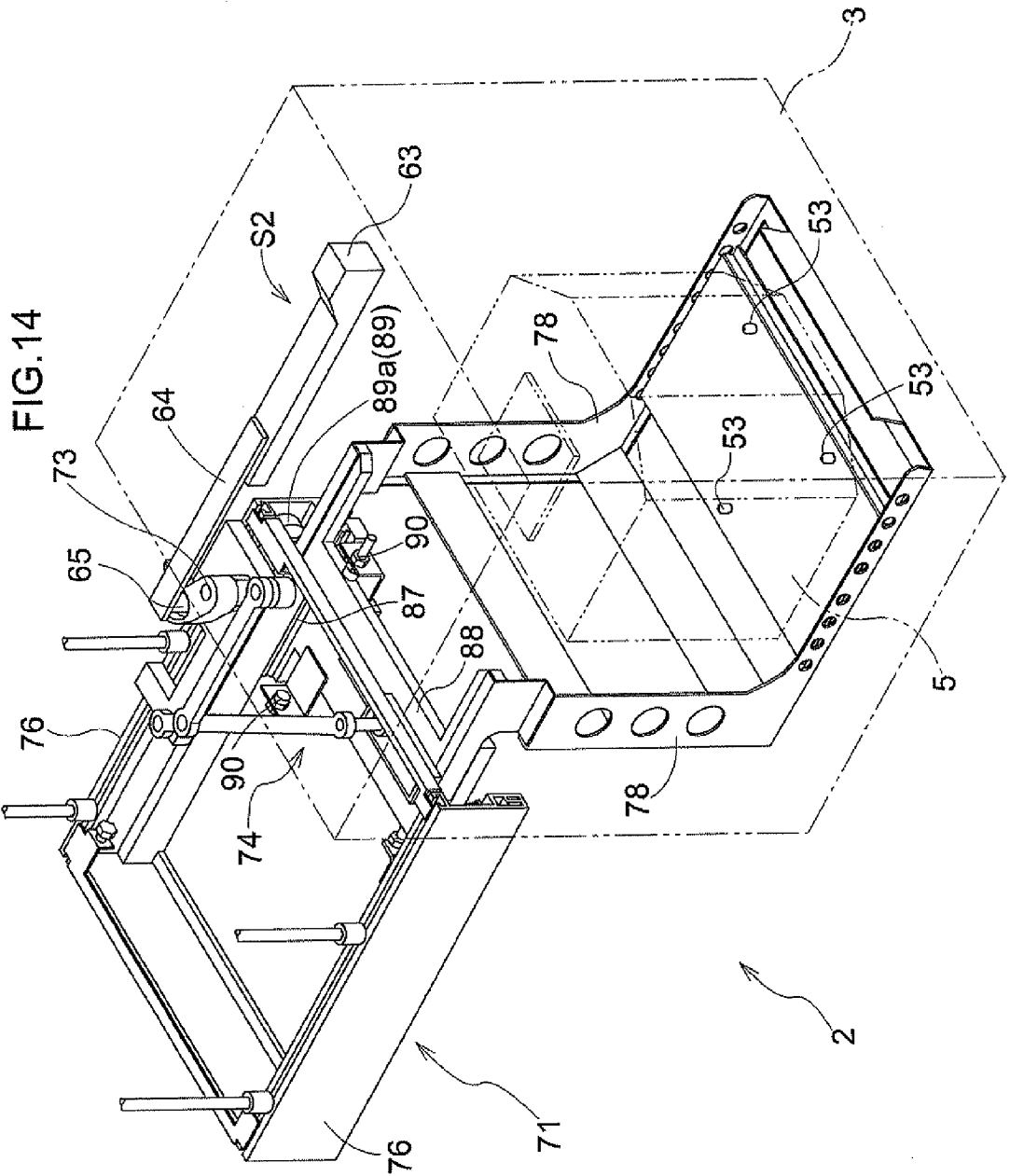

ARTICLE STORAGE FACILITY

BACKGROUND OF THE INVENTION

1. Field of the Invention

The present invention relates to an article storage facility provided with an article storage rack in which a plurality of article storage units for storing an article is provided so as to be aligned in a horizontal direction and a vertical direction, and an article transporter capable of moving along a path via an article transfer location with respect to the article storage rack, wherein an article loader for bringing articles into and taking articles out of the article storage rack is provided to the article storage rack so as to be able to project and retract between a protruding position for article transfer that projects to the outside of the article storage rack, and a retracted position for retracting in the direction of the article storage rack, and wherein an article is delivered or received by the article loader in the protruding position in a state in which the article transporter is stopped at the article transfer location.

2. Description of the Related Art

In the article storage facility, the article loader is provided so as to be able to project and retract between the protruding position and the retracted position; when an article is not being brought in or taken out, the article loader is retracted to the retracted position, the article transporter is stopped in the article transfer location in order to bring in or take out an article with respect to the article storage rack; and when an article is delivered and received by the article loader, the article loader projects to the protruding position so as to allow the article to be delivered and received by the article transporter.

The article storage rack is provided with protrusion and retraction operating means for operating the protrusion and retraction of the article loader between the protruding position and the retracted position (for example, see WO2004/034438, or the corresponding JP 2006-515256).

The article loader is provided so as to be able to project and retract between the protruding position for projecting to the outside of the article storage rack, and the retracted position for retraction to the inside of the article storage rack, and an article can be moved to the inside and the outside of the article storage rack. Therefore, the space in which the article loader projects can be effectively utilized by causing the article loader to retract to a retracted state, and when the article storage rack or the article transporter is positioned in a downflow-type clean space, an air current downflow can be prevented from being disturbed by the article loader that projects from the article storage rack by causing the article loader to retract to the retracted state in advance.

However, the article loader provided to the article storage rack is not limited to a single unit, and numerous article loaders are sometimes provided, and the article storage rack provided to the article loader is also not limited to a single unit, and numerous article storage racks are sometimes provided along the path of the article transporter. Therefore, when the protrusion and retraction operating means for operating the protrusion and retraction of the article loader is provided to the article storage rack as in the conventional article storage facility described above, the protrusion and retraction operating means is provided to each of the numerous article loaders when numerous article loaders are provided. Therefore, the structure of the article storage rack become complex, and there is a risk of increased complexity of the structure of the article storage facility as a whole.

SUMMARY OF THE INVENTION

The present invention was developed in view of the situation described above, and an object of the present invention is to provide an improved article storage facility.

An article storage facility comprises: an article storage rack in which a plurality of article storage units for storing articles is provided so as to be arranged in a horizontal direction and a vertical direction; an article transporter configured to move along a path via an article transfer location for said article storage rack; and an article loader for bringing articles into and taking articles out of said article storage rack, said article loader being provided to said article storage rack so as to be able to project and retract between a protruding position for article transfer that projects to an outside of said article storage rack, and a retracted position for retracting toward said article storage rack, wherein said article transporter is configured to deliver an article to or receive an article from said article loader in said protruding position when said article transporter is at said article transfer location; and protrusion and retraction operating means provided to said article transporter for operating said article loader between said protruding position and said retracted position when said article transporter is at said article transfer location.

That is, the protrusion and retraction operating means provided to the article transporter is configured to cause the article loader to protrude and retract between the protruding position and the retracted position. There is therefore no need to provide a protrusion and retraction operating means to the article loader.

BRIEF DESCRIPTION OF THE DRAWINGS

FIG. 14 is a perspective view showing the support panel in the article receipt position according to another embodiment.

DESCRIPTION OF THE PREFERRED EMBODIMENTS

Embodiments of the article storage facility of the present invention will be described hereinafter based on the drawings.

Figure 1:
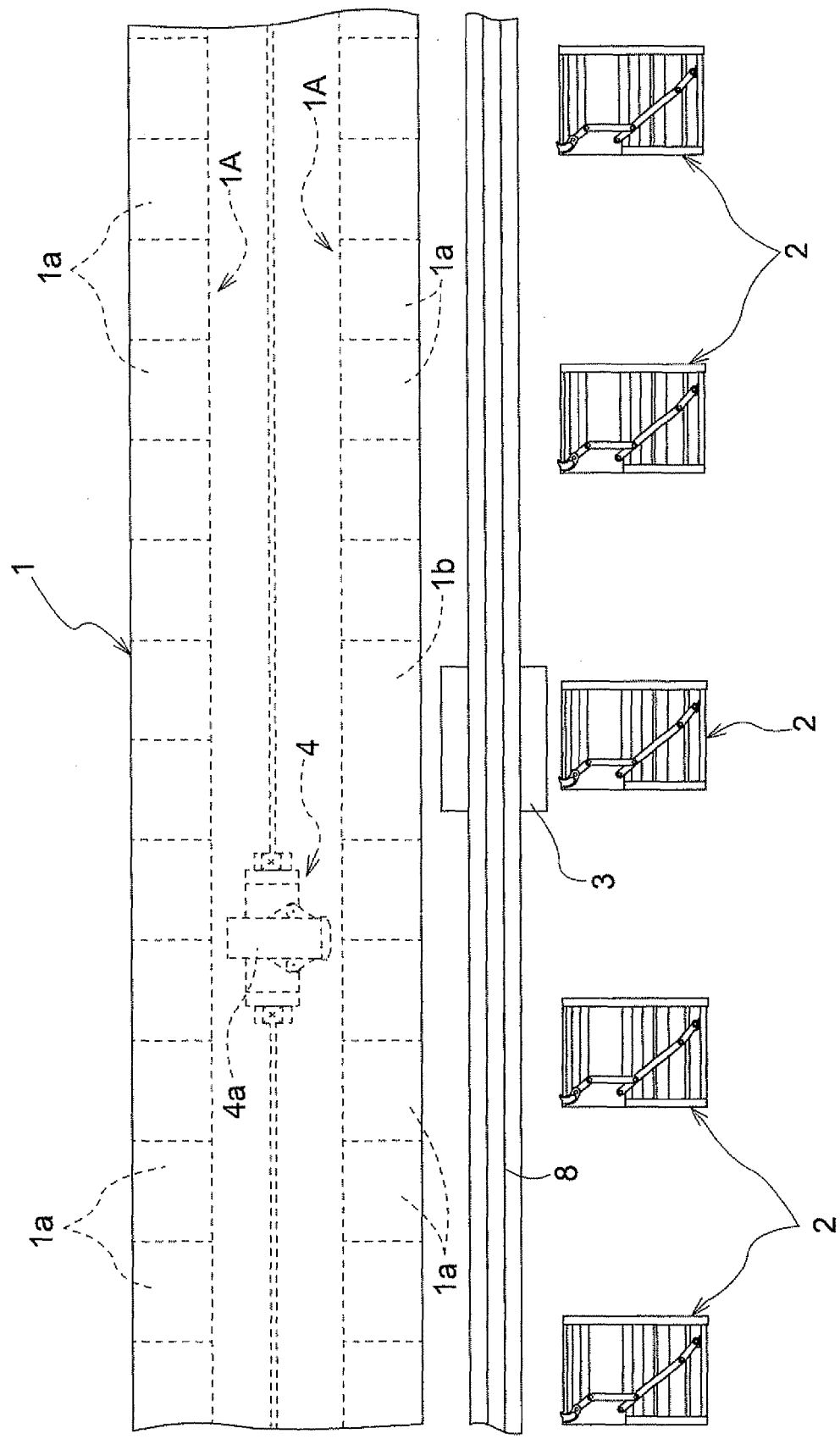
FIG. 1 is a plan view showing the article storage facility.
Figure 2:
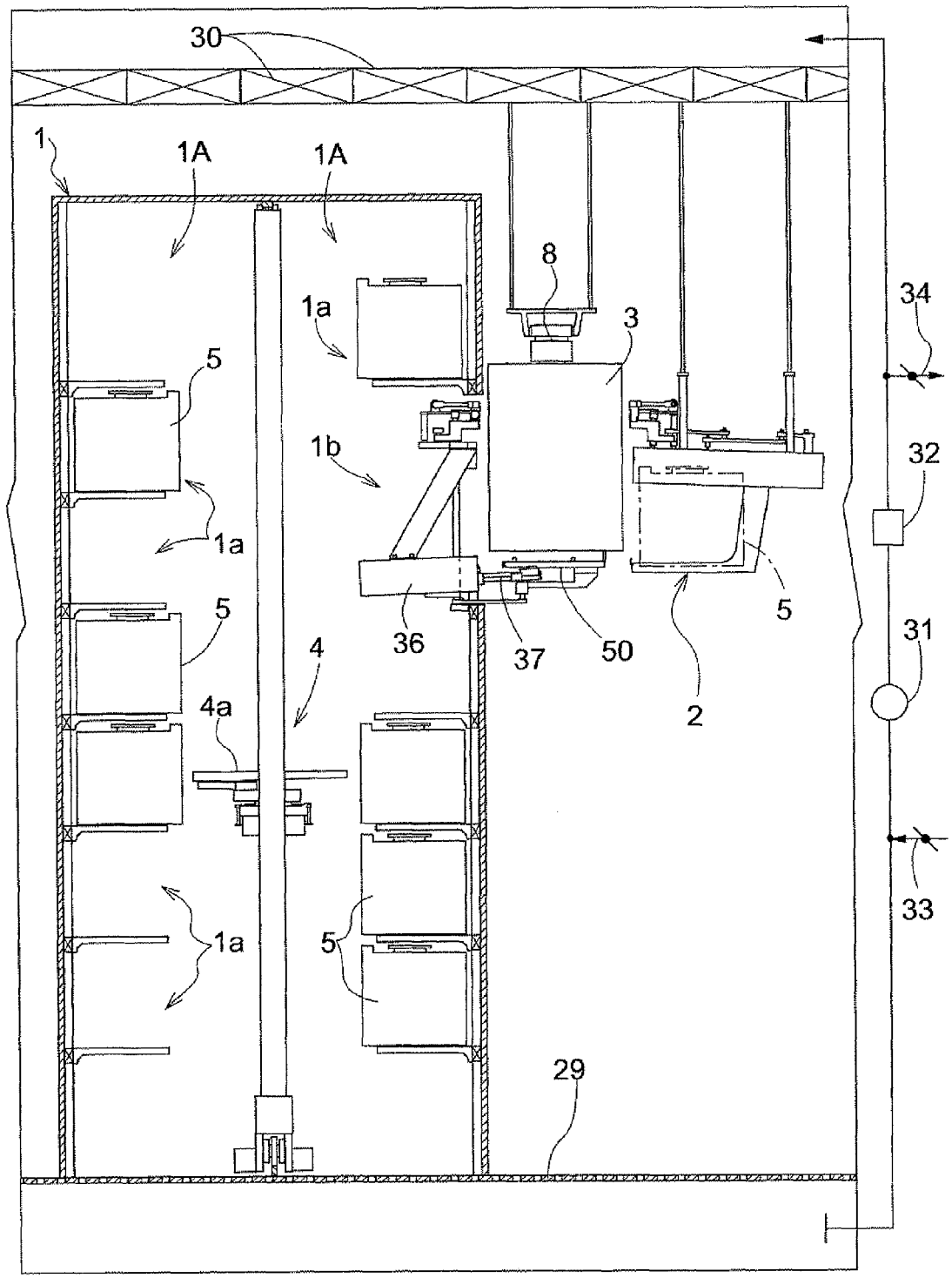
FIG. 2 is a side view showing the article storage facility.

As shown in FIGS. 1 and 2, the article storage facility is composed of an article storage rack 1 disposed on a floor surface, a holding rack 2 suspended from a ceiling, and a vehicle 3 as an article transporter capable of moving along a path that passes through an article loading location with respect to the article storage rack 1, and an article transfer location with respect to the holding rack 2.

The article storage rack 1 is provided with article storage units 1a in vertical and horizontal directions for storing a container 5 as an article, and the holding rack 2 is configured to temporarily store a single container 5.

Although not shown in the drawings, the article storage facility is also provided with an article processing part for performing prescribed processing for semi-finished products or the like during manufacturing of a semiconductor substrate, and the path is set so as to also pass through an article transfer location with respect to the article processing part.

As shown in FIG. 2, a loading panel 50 for carrying out and bringing in articles of the article storage rack 1 is provided so as to be able to project and retract to a projection position (see FIG. 6) for article receipt that is projected to the outside of the article storage rack 1, and a retracted position (see FIG. 7) that is retracted to the inside of the article storage rack 1. The vehicle 3 is configured to perform delivery and receipt of the container 5 with respect to the loading panel 50 in the projection position in a state in which the vehicle 3 is stopped at the article transfer location with respect to the article storage rack 1.

A support panel 81 of the holding rack 2 is provided so as to be able to project and retract to the article receipt position (see FIG. 7) that is projected towards the article storage rack 1, and to the article holding position (see FIG. 6) that is retracted away from the article storage rack 1, and the vehicle 3 is configured to deliver and receive the container 5 with respect to the support panel 81 in the article receipt position in a state in which the vehicle 3 is stopped at the article transfer location with respect to the holding rack 2.

The loading panel 50 corresponds to the article loader, the support panel 81 corresponds to the article holding rack, and the article transfer location with respect to the article storage rack 1 is set in the same location as the article transfer location with respect to the support panel 81 (holding rack 2) that is positioned at the front surface of the loading panel 50 provided to the article storage rack 1.

As shown in FIG. 2, a guide rail 8 for guiding and supporting the vehicle 3 is disposed near the ceiling, and the vehicle 3 is configured to move along a path that is further upward than the loading panel 50 while being guided and supported by the guide rail 8.

The article storage rack 1 is disposed to one side of the path of the vehicle 3, the holding rack 2 is disposed to the other side of the path of the vehicle 3, and the support panel 81 is provided at a distance in the projection direction of the loading panel 50 with respect to the article storage rack 1, in a location opposite the loading panel 50.

Figure 3:
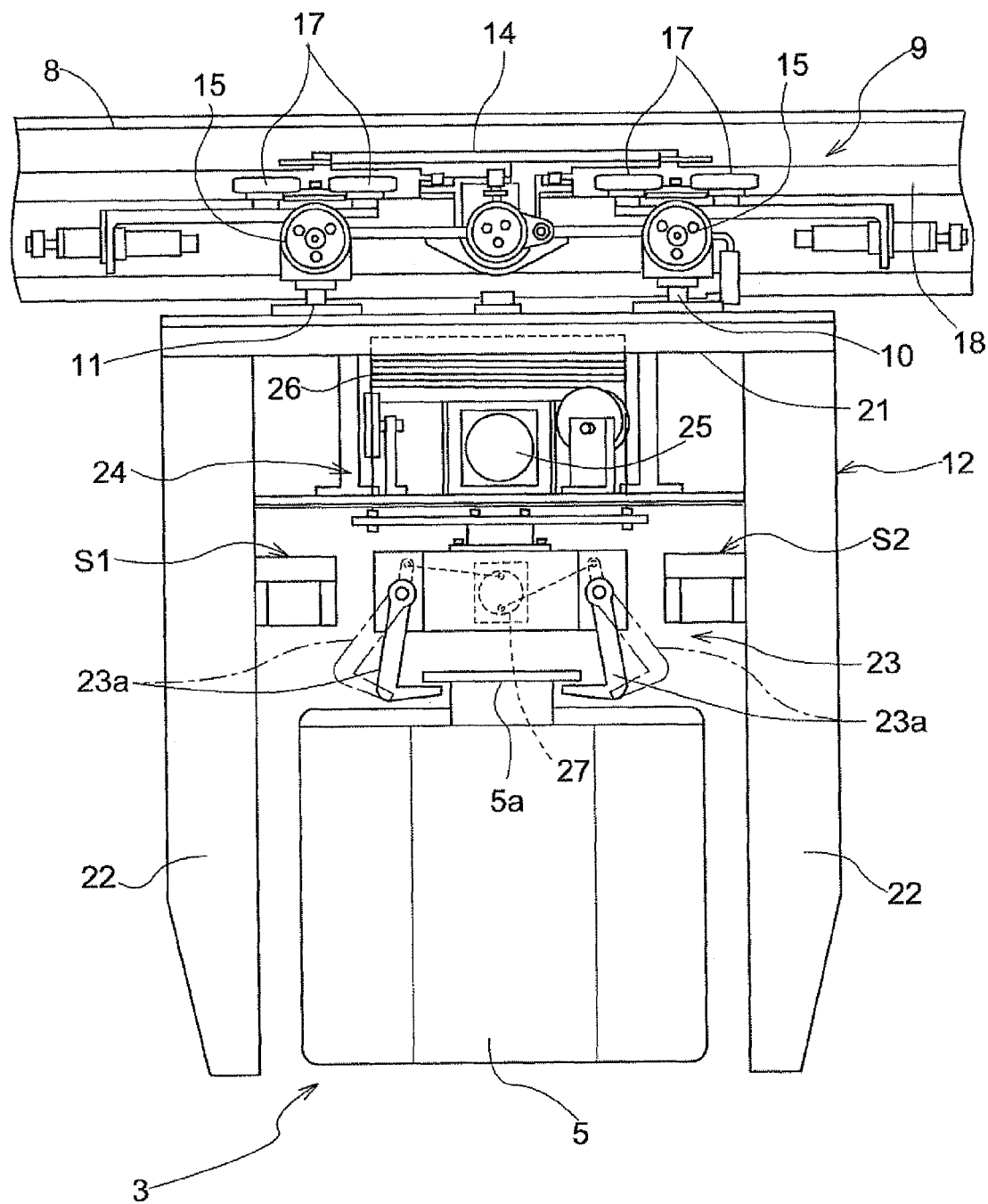
FIG. 3 is a side view showing the vehicle.
Figure 4:
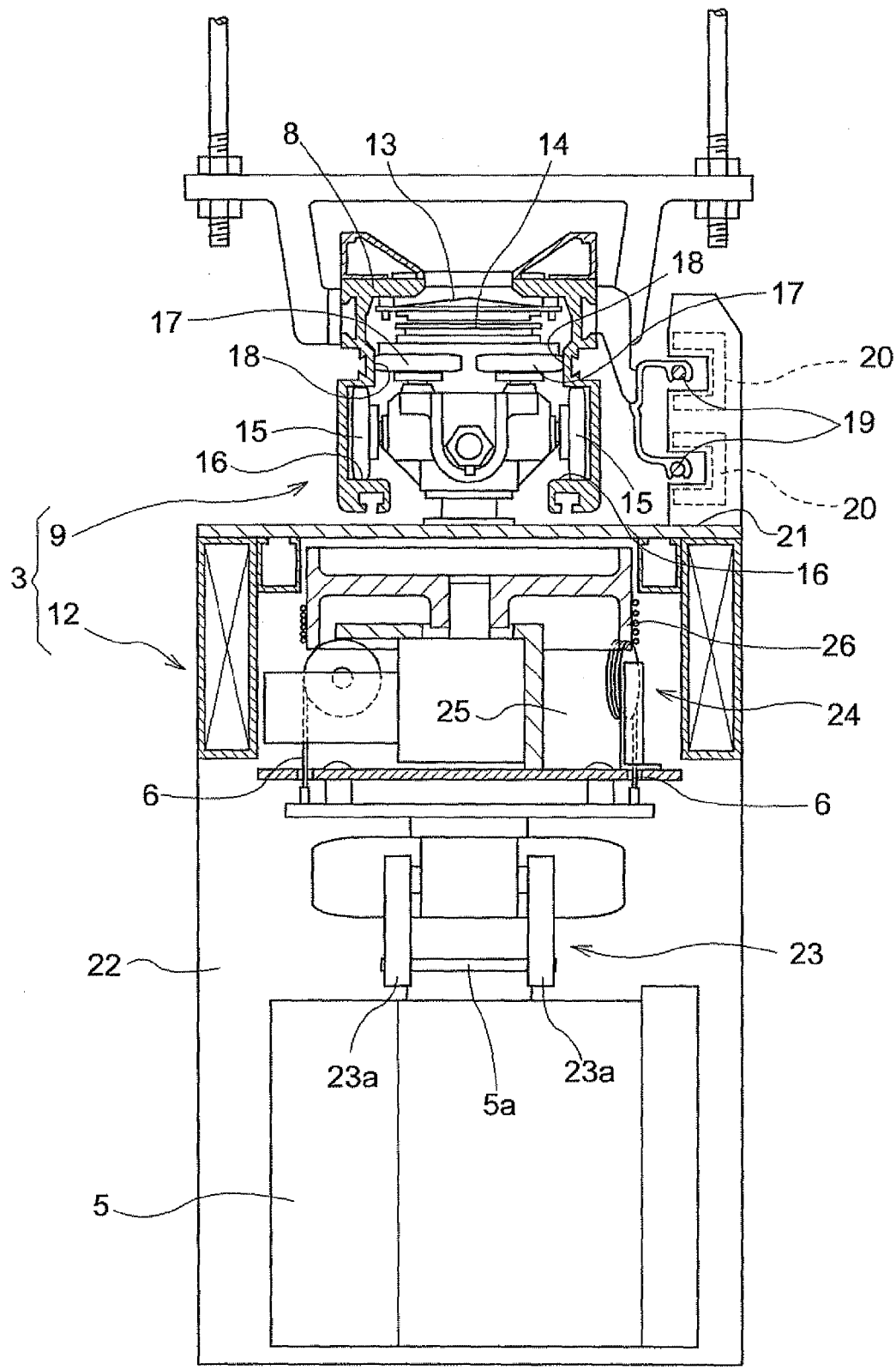
FIG. 4 is a front view showing the vehicle.

As shown in FIGS. 3 and 4, the vehicle 3 is configured with an article holder 23 capable of moving vertically in order to deliver and receive articles to and from the loading panel 50 and the support panel 81.

As shown in FIG. 2, the article storage rack 1, the holding rack 2, and the vehicle 3 are provided within a downflow-type clean space. In other words, the floor of the space in which the article storage rack 1, the holding rack 2, and the vehicle 3 are disposed is formed by a perforated grating floor 29; the ceiling is formed by an air filter 30 composed of a HEPA filter or the like; air drawn in from the grating floor 29 by a blowing fan 31 is recirculated so as to be blown downward as cleaned air from the air filter 30 via a pre-filter 32; and the space in which the article storage rack 1, the holding rack 2, and the vehicle 3 are disposed forms a downflow-type clean space.

An outside air intake channel 33 and an exhaust air channel 34 are connected in the recirculation path in which air is recirculated, and a portion of the air inside the clean space that is recirculated by the blowing fan 31 is exchanged with outside air.

The vehicle 3 will next be described.

As shown in FIGS. 3 and 4, the vehicle 3 is provided with an upper car body 9 that is positioned in an inner space part of the guide rail 8 and is guided in the guide rail 8, and a lower car body 12 that is positioned below the upper car body 9 and connected to the upper car body 9 by front and rear connecting rods 10, 11.

In the upper car body 9, a primary coil 14 is disposed in a state adjacent to and facing a magnet 13 provided to the inside space part of the guide rail 8. The upper car body 9 is configured to move along the guide rail 8 by the propelling force of a linear motor composed of the magnet 13 and the primary coil 14.

The upper car body 9 is also provided with travel wheels 15 for rotating on a travel guide surface 16 that is formed in the inside space part of the guide rail 8, and steadying wheels 17 for rotating on a steadying guide surface 18 that is formed in the inside space part of the guide rail 8.

Furthermore, power receiving coils 20 are provided to the upper car body 9, an alternating current is fed through power supply lines 19 provided along the guide rail 8 to create a magnetic field, the necessary electrical power is generated in the power receiving coils 20 on the side of the vehicle 3 by the magnetic field, and power is supplied to the vehicle 3 in a state of non-contact.

The lower car body 12 is composed of a front and rear frame body 21 to which the connecting rods 10, 11 are connected and which extends in the front and rear directions of the vehicle 3, and a pair of front and rear vertical frame bodies 22 that extend upward from the travel-direction front end location and the travel-direction rear end location of the front and rear frame body 21; and the lower car body 12 is formed in a horseshoe shape that opens downward as viewed from the side. The article holder 23 is provided to the lower car body 12.

The article holder 23 is suspended by four wires 6 that are wound onto a rotating drum 26, and the rotating drum 26 in the lower car body 12 is rotated positively and negatively by a drum driving motor 25 to simultaneously wind and unwind the four wires 6, whereby the article holder 23 is raised and lowered while maintained in a substantially horizontal orientation.

A pair of grasping fixtures 23a for grasping a flange 5a formed at the top of the container 5 is provided to the article holder 23. The pair of grasping fixtures 23a is configured to be able to switch between a grasping mode for swinging towards each other through the positive and negative rotation of a grasping operation motor 27, and a releasing mode in which the pair of grasping fixtures 23a swing away from each other to release the grasping.

The article holder 23 is configured to be swivelled by a swivelling motor not shown in the drawing.

The vehicle 3 is also provided with a projection and retraction operating means S1 for projecting and retracting the loading panel 50 to the projection position and the retracted position in a state of stoppage at the article transfer location with respect to the article storage rack 1, and an article holding rack operating means S2 for projecting and retracting the support panel 81 to the article receipt position and the article holding position in a state of stoppage at the article transfer location with respect to the holding rack 2.

Figure 6:
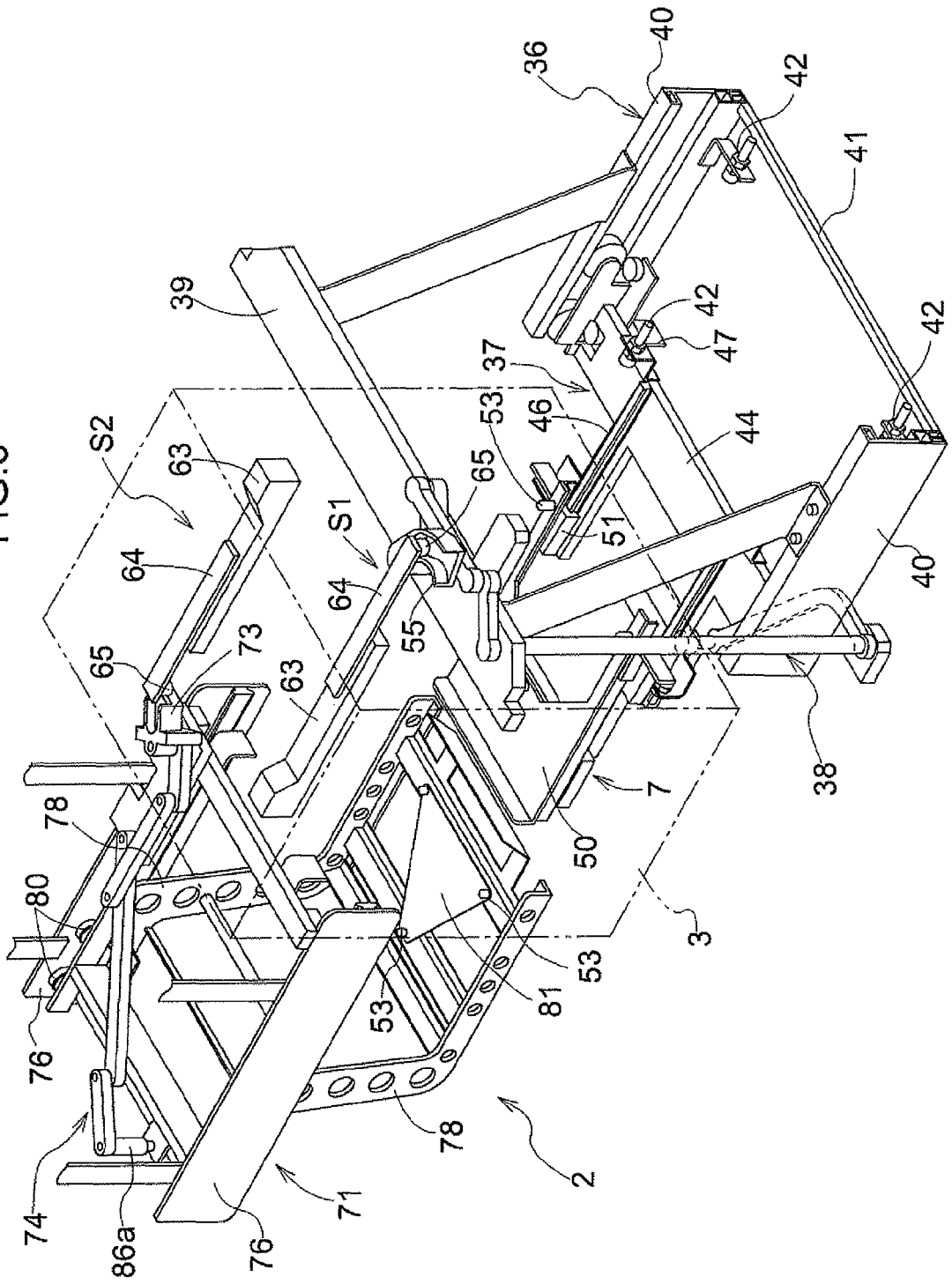
FIG. 6 is a perspective view showing the loading panel of the protruding position, and the support panel of the article holding position.
Figure 7:
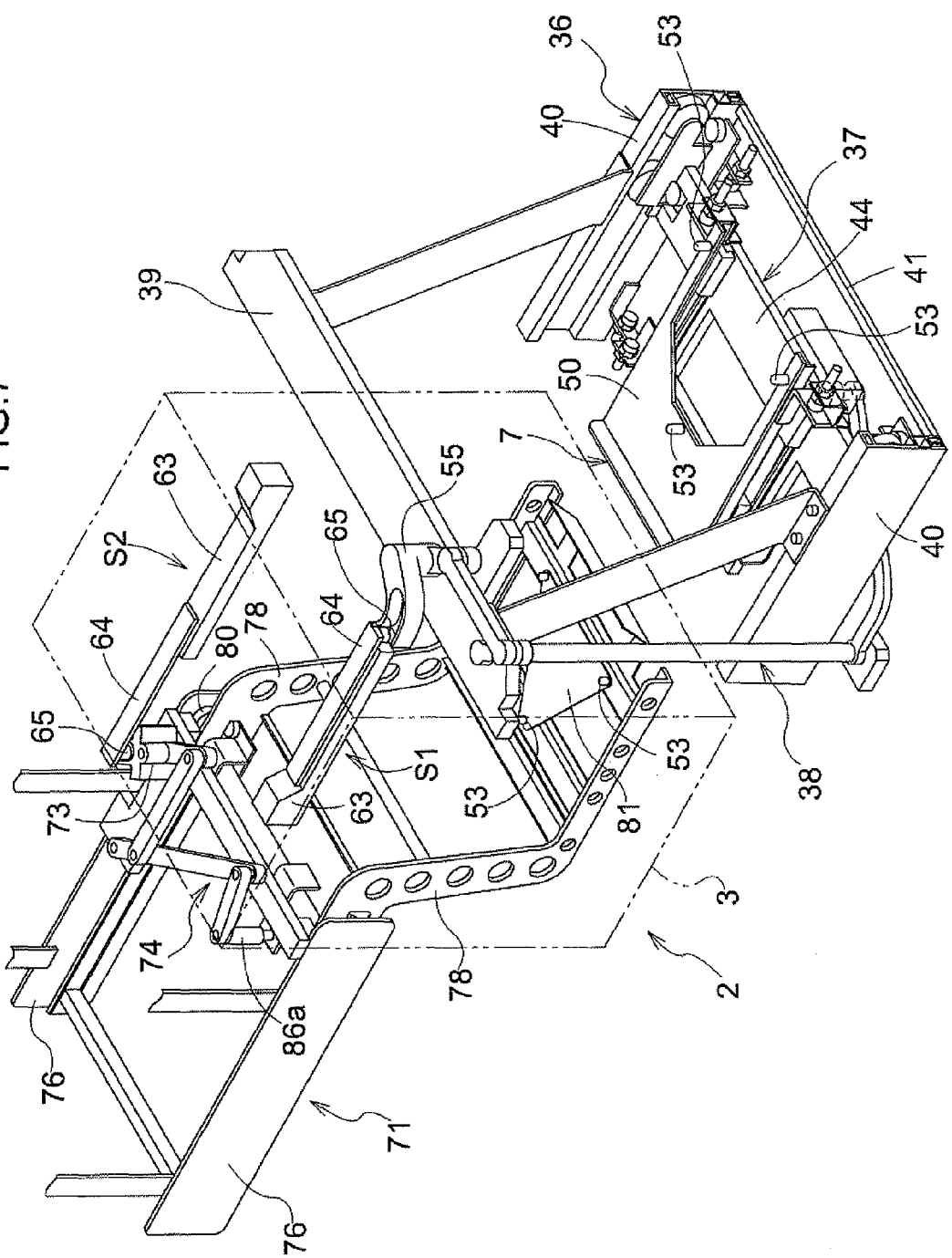
FIG. 7 is a perspective view showing the loading panel in the retracted position, and the support panel in the article receipt position.

As shown in FIGS. 6 and 7, the projection and retraction operating means S1 and the projection and retraction operating means S2 are each provided with a base 63 that is elongated in the front and rear direction of the rack fixed to the vehicle 3, an elongated operating body 64 that is provided so as to be able to move in the front and rear direction of the rack with respect to the base, and a locking roller 65 that is provided on the lower surface of the distal end of the operating body 64. The projection and retraction operating means S1 and the projection and retraction operating means S2 are also each configured to project and retract the operating body 64 with respect to the base 63 by the operation of an actuator not shown in the drawing, and to perform the projection operation for moving the locking roller 65 towards the rack, and the retracting operation for moving the locking roller 65 away from the rack. The actuator is preferably an electric motor or a linear actuator, and the operating body 64 can be moved in relation to the base 63 by a helical shaft or other conventional technique.

The article storage rack 1 will next be described.

As shown in FIG. 2, the article storage rack 1 is provided with a stocker crane 4 as an article transfer device capable of moving horizontally, upward, and downward so as to transport a container 5 between the article storage units 1*a* and the loading panel 50 in the retracted position.

In other words, the article storage rack 1 is provided with a pair of storage rack portions 1A that are disposed at a distance so that the incoming and outgoing directions thereof are facing each other, and the stocker crane 4 that moves horizontally along the width direction of the rack is provided between the pair of storage rack portions 1A.

No detailed description of the stocker crane 4 will be given, but a guide post is provided to a travel carriage that travels on a rail along the width direction of the rack, and a fork device 4*a* for receiving a container 5 is provided between the article storage units 1*a* or the loading panel 50 and an elevator platform as such that moves vertically along the guide post. The elevator platform may be configured to move vertically along the guide post by being driven via a wire or helical shaft by an electric motor provided to the travel carriage. A jointed robot arm or another conventional technique may also be utilized instead of such a fork device.

The plurality of article storage units 1*a* is provided to the storage rack portions 1A so that a plurality of rows extending in the vertical direction, and a plurality of rows extending in the transverse direction (horizontal direction) are formed.

Figure 5:
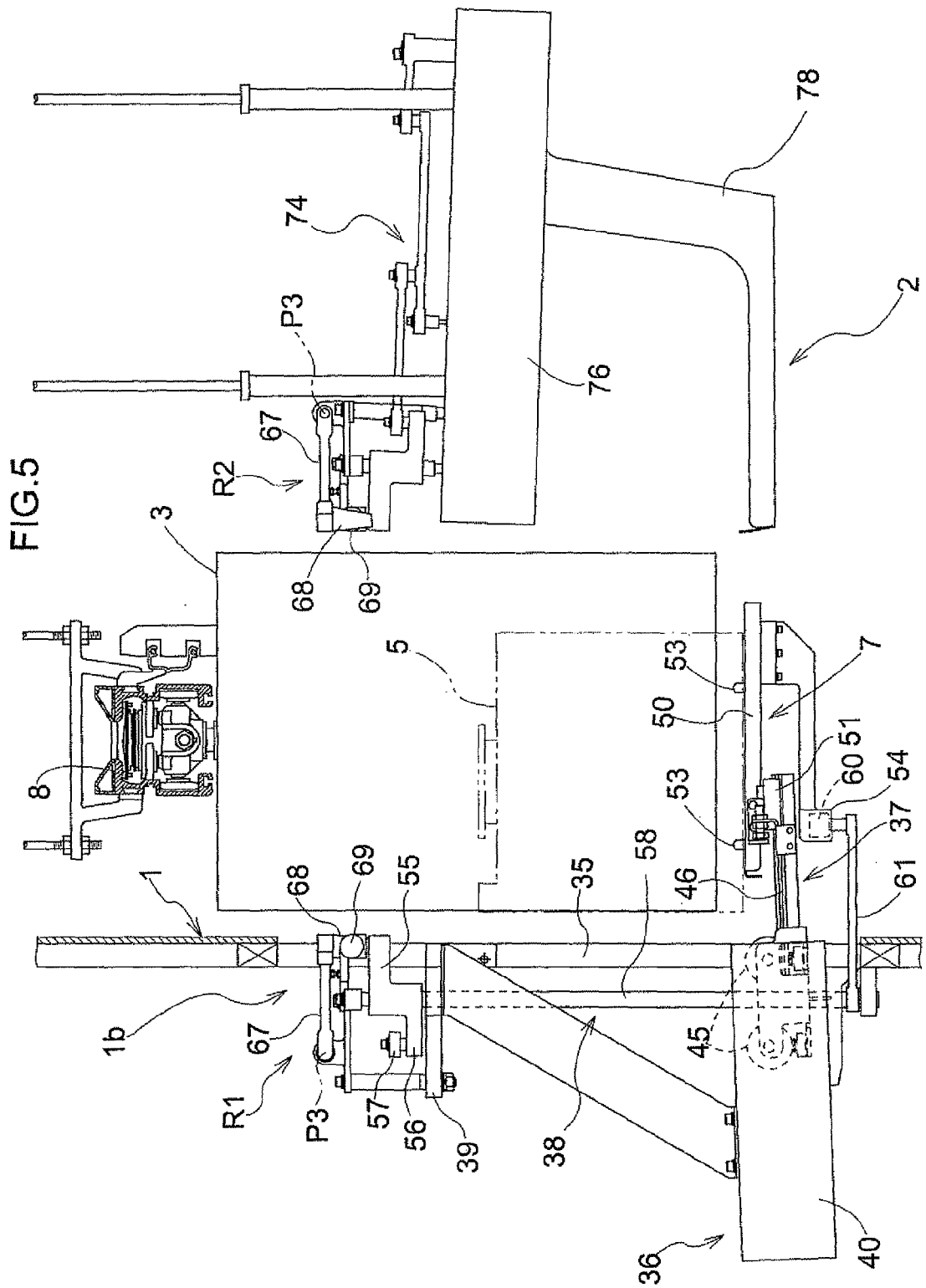
FIG. 5 is a side view showing the loading panel of the protruding position, and the support panel of the article holding position.

As shown in FIG. 5, a main guide rail 40 for guiding and supporting a movable guide rail 46 so as to be able to move in the projection and retraction movement direction of the loading panel 50 is provided to the article storage rack 1*r* and the loading panel 50 is guided and supported by the movable guide rail 46 so as to be able to move in the projection and retraction movement direction. The movable guide rail 46 corresponds to the movable guide, and the main guide rail 40 corresponds to the main guide.

An article discharge and intake part 1*b* for carrying out and bringing in articles is provided to the article storage rack 1, and the article discharge and intake part 1*b* is formed in the second level from the top in the storage rack portions 1A on the side on which the path of the vehicle 3 is positioned, and is formed in the portion that corresponds to the two article storage units 1*a* arranged in the width direction of the rack.

The article storage rack 1 is covered by a wall part, the portion of the wall part that corresponds to the article discharge and intake part 1*b* is open, and the container 5 is carried out and brought in through the opening.

The article discharge and intake part 1*b* in the article storage rack 1 will next be described. The side on which the vehicle 3 is positioned in the front and back direction of the rack will be referred to as the forward side, and the side on which the stocker crane 4 is positioned will be referred to as the rearward side.

As shown in FIG. 5, in the article discharge and intake part 1*b* in the article storage rack 1, a main guide frame 36 is provided across a pair of support pillars 35 arranged in the width direction of the rack, and a movable guide frame 37 is directly guided and supported so as to be able to move in the front and rear direction of the rack (the projection and retraction movement direction of the loading panel 50) in relation to the main guide frame 36. An article loading frame 7 is directly guided and suspended so as to be able to move in the front and rear direction of the rack in relation to the movable guide frame 37; and a storage operated body 55 directly operated by the projection and retraction operating means S1, a storage link mechanism 38 for operating the storage operated body 55 in conjunction with the article loading frame 7, and a storage locking means R1 for locking the article loading frame 7 in the retracted position are provided.

Figure 8:
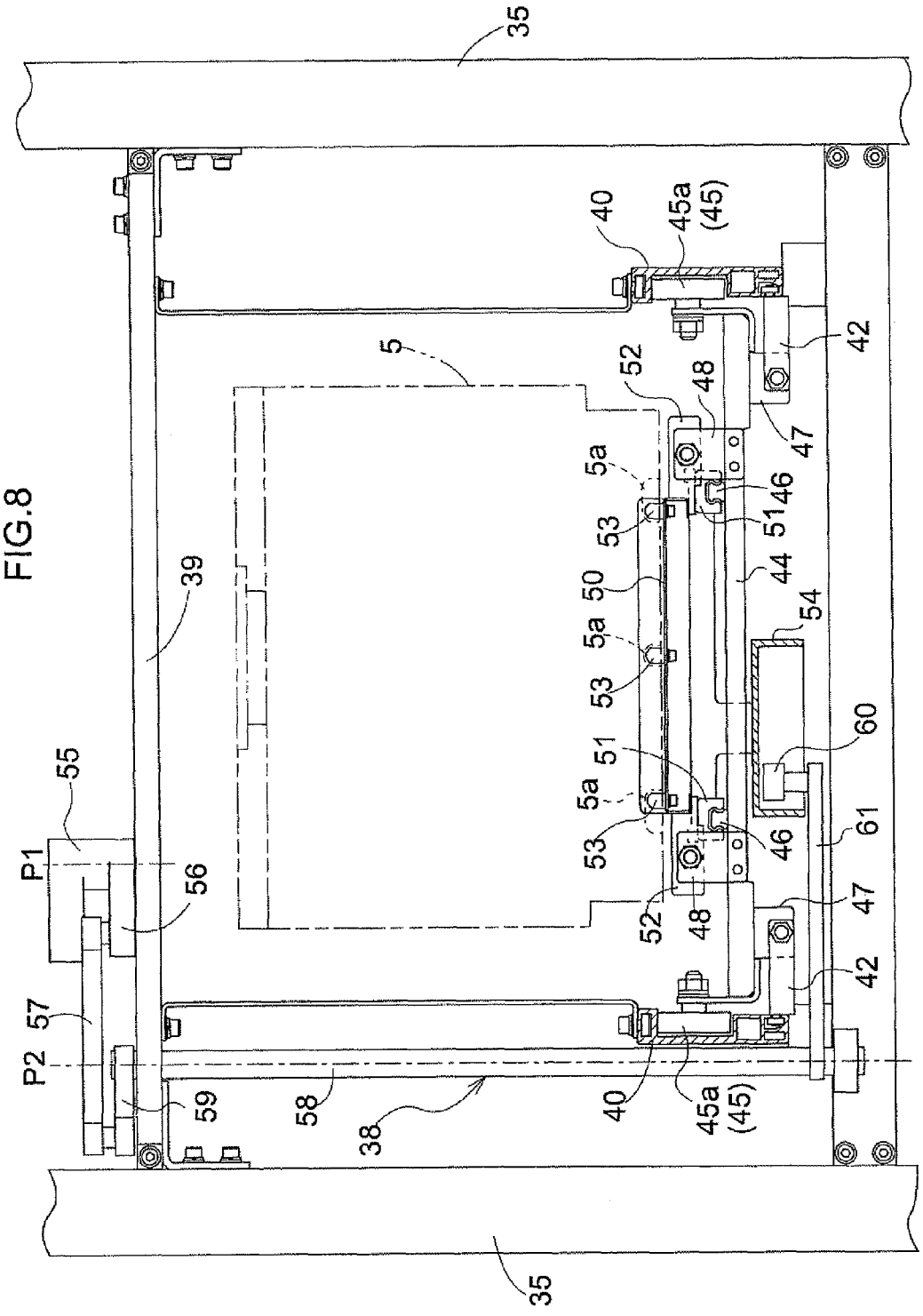
FIG. 8 is a back view showing the article loader.
Figure 9:
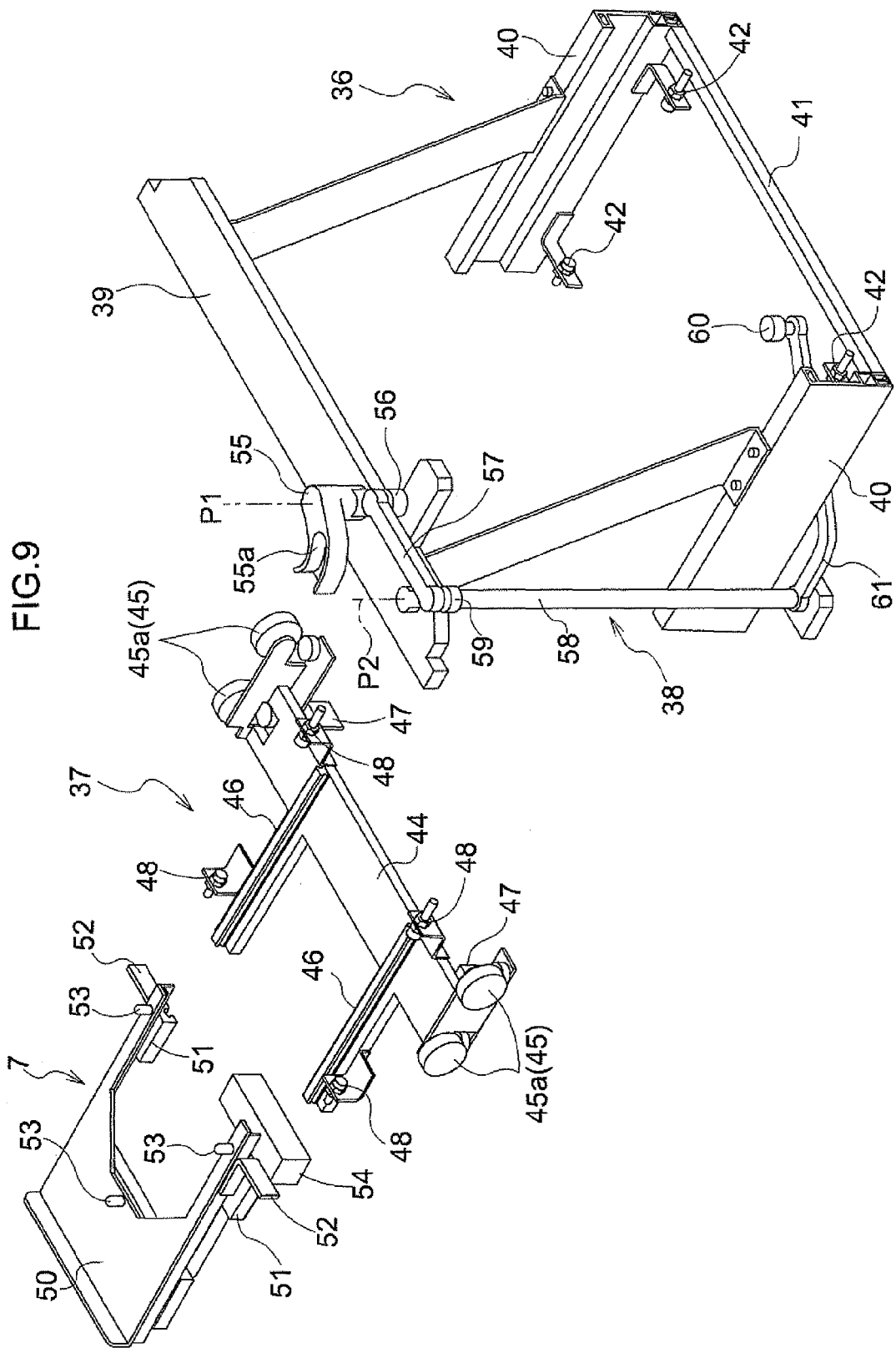
FIG. 9 is an exploded perspective view showing the guide structure of the article loader.

As shown in FIGS. 8 and 9, the main guide frame 36 is provided with a bridge member 39 that is disposed across the pair of support pillars 35 arranged in the width direction of the rack at the top of the article discharge and intake part 1*b*, a pair of left and right main guide rails 40 whose front end parts are linked to and supported by the bridge member 39, a main guide linking member 41 for linking the rear end parts of the pair of left and right main guide rails 40 to each other, and a pair of left and right main guide restricting members 42 for restricting the movement of the movable guide frame 37 in the front and rear direction of the rack to a set range. The main guide rails 40 are provided at the same height as the loading surface of the loading panel 50.

The pair of left and right main guide rails 40 are formed so that the cross-sectional shape of each as viewed from the front and rear direction is a horseshoe shape that opens to the inside, are provided in a rear-tilting orientation so that the back ends are positioned lower than the front ends, and are configured to be guided and supported in a state so that the movable guide frame 37 is urged to the rear by the weight of the movable guide frame 37.

The pair of left and right main guide restricting members 42 are each provided with a main guide restricting member 42 for retraction that is linked and supported in a state of projecting towards the inside at the lower end of the rear part of the main guide rails 40, and that restricts the movement of the movable guide frame 37 further to the rear than the set movement range in relation to the main guide frame 36; and a main guide restricting member 42 for projection that is linked and supported in a state of projecting towards the inside at the lower end of the front part of the main guide rails 40, and that restricts the movement of the movable guide frame 37 further forward than the set movement range in relation to the main guide frame 36.

The movable guide frame 37 is provided with a plate-shaped movable guide plate 44, a pair of left and right movable guidance guided members 45 provided to both end parts in the width direction of the rack in the rear part of the movable guide plate 44, a pair of left and right movable guiding rails 46 provided so as to be positioned between the pair of left and right movable guidance guided members 45, a pair of left and right movable guiding contacted members 47 for making contact with the main guide restricting members 42, and a pair of left and right movable guidance restricting members 48 for restricting the movement of the article loading frame 7 to a set range in the front and rear direction of the frame. The movable guiding rails 46 are indirectly guided and supported by the main guide rails 40 via the movable guide plate 44 and the pair of left and right movable guidance guided members 45, and are provided in a position slightly lower than the loading panel 50.

The left and right movable guidance guided members 45 are each composed of a pair of front and rear guided wheels 45a and configured to roll with respect to the main guide rails 40. The pair of front and rear guided wheels 45a is arranged along the longitudinal direction of the movable guiding rails 46, and the movable guide frame 37 is guided and supported so that the rear end part at the main guide frame 36 is positioned in a rear-tilting orientation lower than the front end part.

The left and right movable guiding contacted members 47 are each configured to correspond to main guide restricting members 42 for retraction or projection that are linked and supported in a state of projecting downward at the rear part in between the movable guiding rails 46 and the movable guidance guided members 45 of the movable guide plate 44.

The left and right movable guidance restricting members 48 are composed of a movable guidance restricting member 48 for retraction that is linked and supported in a state of projecting upward to the rear part in between the movable guiding rails 46 and the movable guidance guided members 45 of the movable guide plate 44, and that restricts the movement of the article loading frame 7 further to the rear than the set movement range in relation to the movable guide frame 37; and a movable guidance restricting member 48 for projection that is linked and supported in a state of projecting upward to the front part in between the movable guiding rails 46 and the movable guidance guided members 45 of the movable guide plate 44, and that restricts the movement of the article loading frame 7 further forward than the set movement range in relation to the movable guide frame 37.

The article loading frame 7 is provided with the plate-shaped loading panel 50 for loading and supporting a container 5, a pair of left and right loading guided members 51 provided to both end parts in the width direction of the rack in the rear part of the loading panel 50, and a pair of left and right loading contacted members 52 that correspond to the movable guidance restricting members 48.

The left and right loading guided members 51 are each composed of a linear block, and are configured to slide in relation to the movable guiding rails 46 formed by linear guides.

The loading guided members 51 are each linked and supported in a rear-tilted orientation in relation to the loading panel 50, and are configured to be guided and supported in a rear-tilted orientation in which the rear end parts are positioned lower than the front end parts at the movable guide frame 37 while the loading surface of the loading panel 50 is held in a horizontal orientation.

The left and right loading contacted members 52 are each linked and supported in a state of projecting outward to the sides of the loading panel 50, and are configured to come in contact with the movable guidance restricting members 4S for retraction or projection.

The loading panel 50 is cut out in a U shape at the rear part thereof so that a space is formed for raising and lowering of the fork device 4a in the stocker crane 4, and a total of three article positioning members 53 are formed at the front and on both sides in the width direction of the rack in the cut-out part of the loading panel 50. In other words, three engaging parts 5b are formed in the lower surface of the container 5 so as to correspond to the article positioning members 53, and the container 5 is loaded and supported so that the article positioning members 53 are locked in the engaging parts 5b, whereby the container 5 is prevented from becoming misaligned in the width direction or the front and rear direction of the rack in relation to the loading panel 50.

A space for insertion and withdrawal of the fork device 4a in the stocker crane 4 is formed between the movable guide plate 44 of the movable guide frame 37 and the loading panel 50 of the article loading frame 7.

The storage operated body 55 is supported so as to be able to swing about a vertical axis P1 by the bridge member 39 that is provided across the pair of support pillars 35, and is supported so as to be able to move to an adjacent position in which the distal end is further forward than the vertical axis P1, and a spaced position in which the distal end is further to the rear than the vertical axis P1 through swinging about the vertical axis P1. The storage operated body 55 is provided so as to be positioned further upward than the container 5 loaded and supported on the loading panel 50.

A groove 55a that extends toward the vertical axis P1 along a direction that intersects with the front and rear direction of the rack is provided to the storage operated body 55 in a state of positioning in an adjacent position. The groove 55a is formed in an elbow shape in which the end part of the front end is opened forward.

The storage operated body 55 and the loading panel 50 are coupled and linked together by a storage linking mechanism 38 that extends in the vertical direction, so that the loading panel 50 is placed in the retracted position when the storage operated body 55 is in the adjacent position, and the loading panel 50 is placed in the projection position when the storage operated body 55 is in the spaced position.

Although not shown in the drawings, a pair of guide rollers for coming in contact with the operating body 64 and guiding the locking roller 65 in the appropriate operating position is provided to both sides of the path in the width direction of the rack.

The storage link mechanism 38 is provided with an operated link 56 for swinging about the vertical axis P1 in integral fashion with the storage operated body 55; a coupling link 57 in which one end part is pivotally connected to the distal end part of the operated link 56; a top link 59 for swinging about a vertical axis P2, in which the other end part of the coupling link 57 is pivotally connected to the distal end part, and the proximal end part is fixed to the upper end part of a rod-shaped member 58; and a bottom link 61 in which the proximal end part is fixed to the lower end part of the rod-shaped member 58, and a roller body 60 is rotatably provided to the distal end part. The operated link 56, the coupling link 57, and the top link 59 are provided in a higher position than the container 5 that is loaded and supported on the loading panel 50, and the bottom link 61 is provided in a lower position than the loading support body 7.

The roller body 60 is engaged with a roller engaging member 54 supportably connected to the lower surface of the loading panel 50, and the loading panel 50 also moves in the front and rear direction of the rack in conjunction with the movement of the roller body 60 in the front and rear direction of the rack.

In the roller engaging member 54, an slot for engaging the roller body 60 is formed so as to be elongated in the width direction of the rack, and the roller engaging member 54 is configured to allow the roller body 60 to move in the width direction of the rack in relation to the roller engaging member 54.

As shown in FIG. 5, the storage locking means R1 is provided with a swinging member 67 in which the rear end part is connected and supported so as to be able to swing about a horizontal axis P3; a restricting panel 68 integrally provided to the swinging member 67 that makes contact with and restricts the storage operated body 55 from moving from the adjacent position to the spaced position; and a releasing roller 69 provided to the swinging member 67 so as to be able to rotate. The storage locking means R1 is configured to be switched between a lock state in which the restricting panel 68 advances into the path of the storage operated body 55, and a lock release state in which the restricting panel 68 withdraws from the path of the storage operated body 55.

The following description is of the movement of the movable guide frame 37, the article loading frame 7, the storage locking means R1, the storage link mechanism 38, and the storage operated body 55 when the loading panel 50 is projected to the projection position and retracted to the retracted position. The movement of the storage locking means R1 is not shown in the drawings.

When the loading panel 50 is projected from the retracted position to the projection position, the projection operation of the projection and retraction operating means S1 provided to the vehicle 3 is performed in a state in which the vehicle 3 is stopped in the article transfer location with respect to the article storage rack 1.

At the start of the projection operation of the projection and retraction operating means S1, the releasing roller 69 is pushed upward by the protruding operating body 64, and the swinging member 67 swings upward, whereby the storage locking means R1 is then switched to the lock release state in which the restricting panel 68 is withdrawn from the path of the storage operated body 55.

Figure 10:
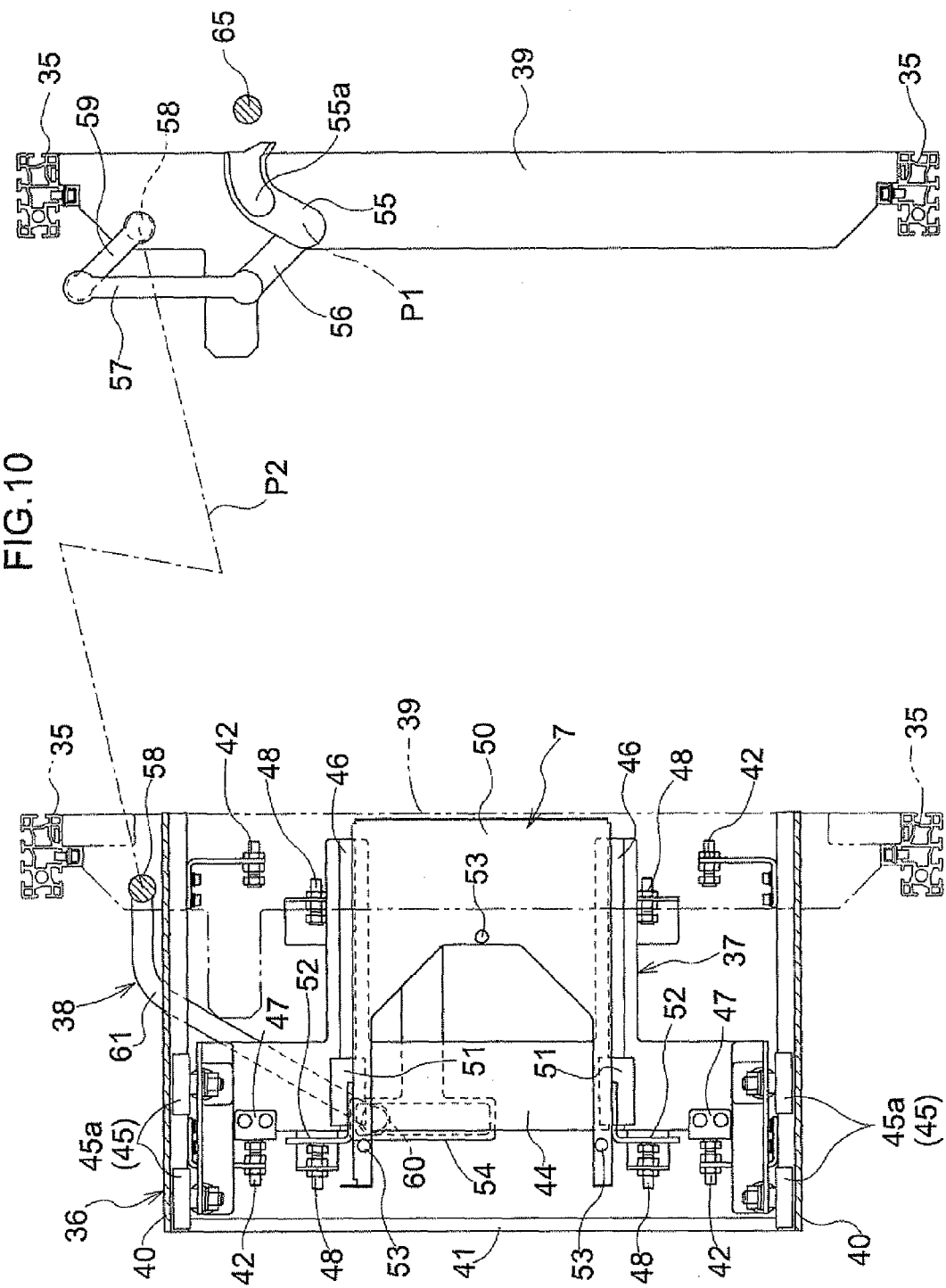
FIG. 10 is an operation diagram showing the loading panel of the retracted position.
Figure 11:
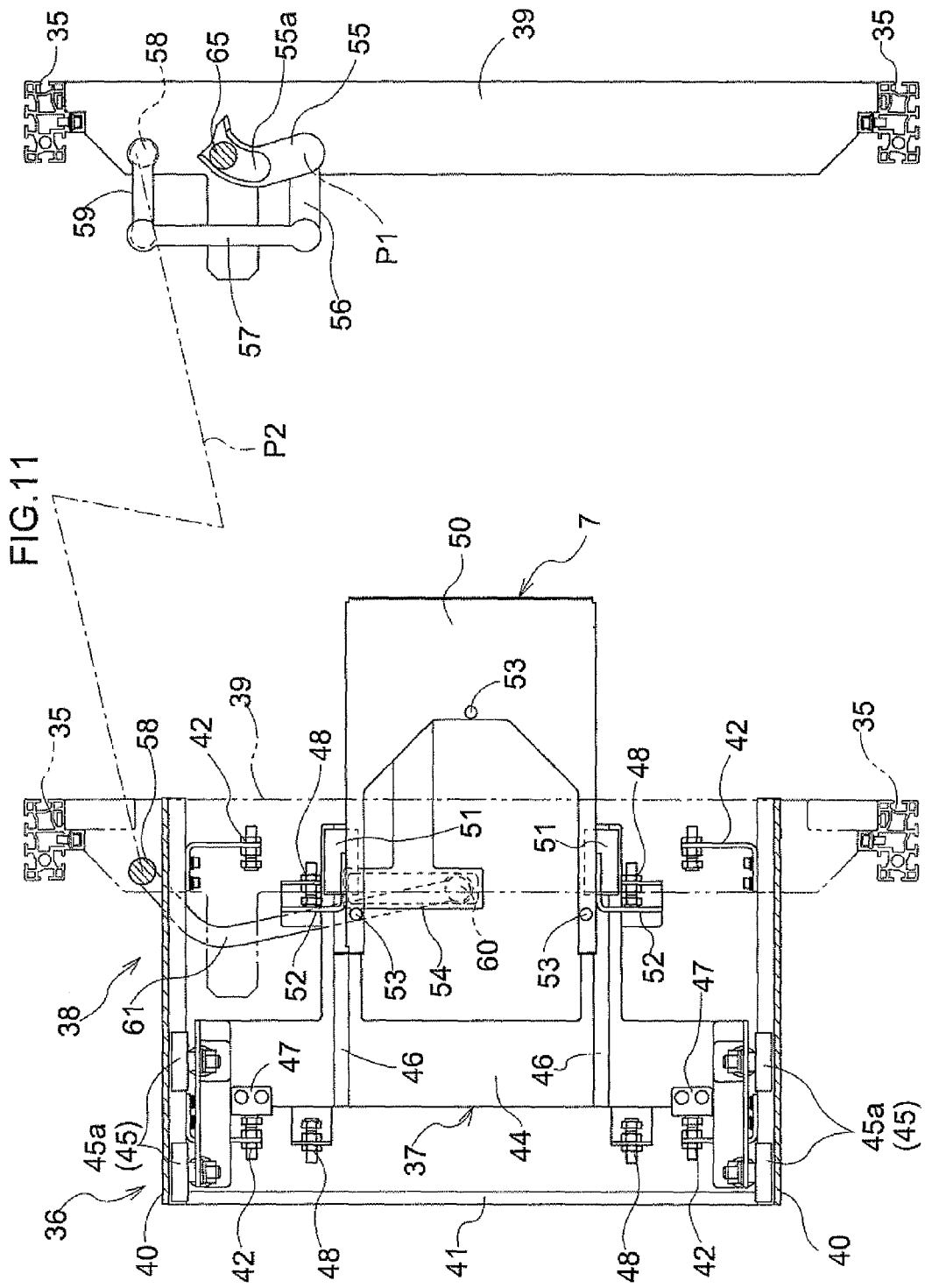
FIG. 11 is an operation diagram showing the loading panel during movement.
Figure 12:
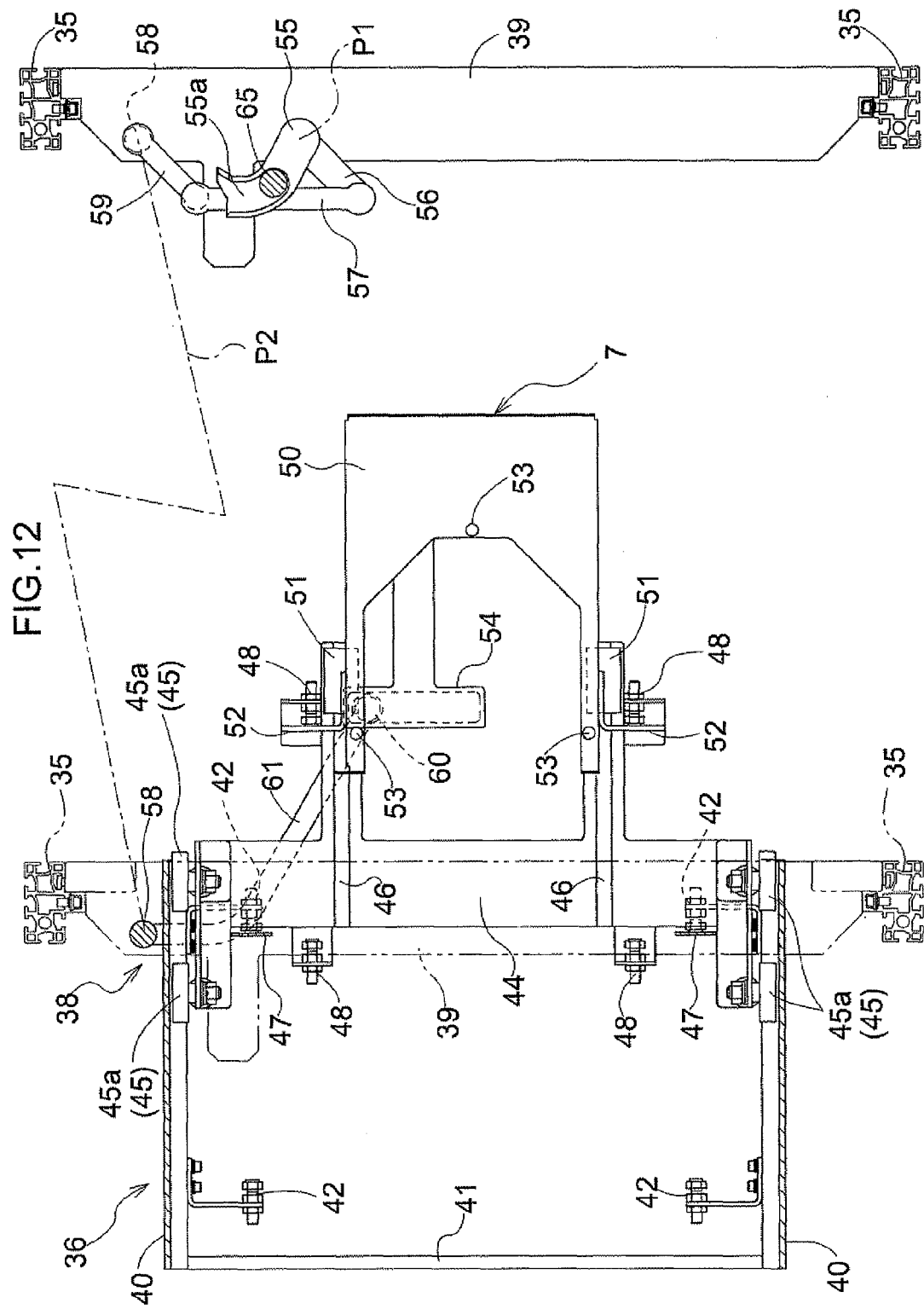
FIG. 12 is an operation diagram showing the loading panel of the protruding position.

As shown in FIGS. 10 through 12, the locking roller 65 is engaged in the groove 55a of the storage operated body 55 by the projection operation of the projection and retraction operating means S1, the side surface inside the groove 55a is then pushed, and the storage operated body 55 is switched from the adjacent position to the spaced position in the counter-clockwise direction as viewed in a plane.

When the storage operated body 55 is thus operated from the adjacent position to the spaced position in the counter-clockwise direction as viewed in a plane, the operated link 56, the top link 59, and the bottom link 61 also each swing counter-clockwise, and the roller body 60 moves forward, whereby the loading panel 50 moves from the retracted position to the projection position.

During movement of the loading panel 50 from the retracted position to the projection position, the loading guided members 51 of the article loading frame 7 first slide on the movable guiding rails 46 of the movable guide frame 37, and the article loading frame 7 moves forward with respect to the movable guide frame 37. As shown in FIG. 11, when the article loading frame 7 moves to the front end in the set movement range with respect to the movable guide frame 37, the movable guidance restricting members 48 for projection make contact with the loading contacted members 52. The article loading frame 7 and the movable guide frame 37 then integrally move forward in a state in which the movable guide frame 37 is pushed by the article loading frame 7, whereby the guided wheels 45a of the movable guide frame 37 roll on the main guide rails 40 of the main guide frame 36, the movable guide frame 37 moves forward with respect to the main guide frame 36, and the loading panel 50 moves to the projection position, as shown in FIG. 12.

When the loading panel 50 is retracted from the projection position to the retracted position, the retraction operation is performed in the projection and retraction operating means S1 in which the projection operation is performed in the manner described above.

The storage operated body 55 is configured so that the locking roller 65 at this time separates from the groove 55a after being pulled from the spaced position of the locking roller 65 to the adjacent position by the retraction operation of the projection and retraction operating means S1, as shown in FIGS. 10 through 12. At the end of the retraction operation of the projection and retraction operating means S1, the storage locking means R1 is configured so that the retracting operating body 64 is withdrawn from under the releasing roller 69, and the swinging member 67 swings downward due to the weight of the swinging member 67, whereby the restricting panel 68 advances into the path of the storage operated body 55, and the storage locking means R1 is switched to the lock state.

When the storage operated body 55 is operated clockwise as viewed in a plane from the spaced position to the adjacent position, the operated link 56, the top link 59, and the bottom link 61 each swing clockwise, and the roller body 60 moves towards the rear, whereby the loading panel 50 moves from the projection position to the retracted position.

During movement of the loading panel 50 from the projection position to the retracted position, the loading guided members 51 of the article loading frame 7 first slide on the movable guiding rails 46 of the movable guide frame 37, and the article loading frame 7 moves towards the rear with respect to the movable guide frame 37. When the article loading frame 7 moves to the rear end in the set movement range with respect to the movable guide frame 37, the movable guidance restricting members 48 for retraction make contact with the loading contacted members 52. The article loading frame 7 and the movable guide frame 37 then integrally move toward the rear in a state in which the movable guide frame 37 is pushed by the article loading frame 7, whereby the guided wheels 45a of the movable guide frame 37 roll on the main guide rails 40 of the main guide frame 36, the movable guide frame 37 moves toward the rear with respect to the main guide frame 36, and the loading panel 50 moves to the retracted position, as shown in FIG. 10.

The holding rack 2 will next be described. In the description, the side on which the vehicle 3 is positioned in the front and rear direction of the rack will be referred to as the forward side, and the opposite side will be referred to as the rearward side.

As shown in FIG. 5, a fixed-frame rail 76 for guiding and supporting the support panel 81 in the projection and retraction direction of the support panel 81 is provided so as to correspond to the article storage position of the support panel 81, and the support panel 81 is guided and supported by the fixed-frame rail 76 so as to be able to project and retract in the projection and retraction movement direction.

A holding operated body 73 that is directly operated by the article holding rack operating means S2, a holding link mechanism 74 for coupling the holding operated body 73 with the support panel 81, and a holding lock means R2 for locking the support panel 81 in the retracted position are provided so as to correspond to the article storage position of the support panel 81. The holding operated body 73 and the holding lock means R2 have the same configurations as the storage operated body 55 and the storage locking means R1, respectively, and therefore will not be described.

As shown in FIGS. 6 and 7, a fixed frame 71 provided with a pair of left and right fixed-frame rails 76 is provided so as to correspond to the article storage position of the support panel 81. The left and right fixed-frame rails 76 are suspended from the ceiling and connected to each other by a connecting member, and are provided at the same height as the upper end of the container 5 supported by the support panel 81. The left and right fixed-frame rails 76 are each provided in a rear-tilted orientation in which the rear ends are positioned lower than the front ends, and are guided and supported in a state in which support arm bodies 78 for guiding and supporting are urged toward the rear by the weight of the support arm bodies 78.

The support arm bodies 78 provided so as to correspond to the article storage position of the support panel 81 have a shape that extends to the front and rear, and are provided as a left-right pair that is connected by a connecting member. A pair of left and right holding guided members 80 is provided to the rear parts of the pair of left and right support arm bodies 78, and the support panel 81 for loading and supporting the container 5 is provided to the lower part of the support arm bodies 78.

The left and right support arm bodies 78 are each formed by an upper part that extends along the front and rear direction of the rack and supports the holding guided members 80, a middle part that extends downward from the front end of the upper part, and a lower part that extends forward from the lower end.

A plurality of holes is formed at intervals in the longitudinal direction in the middle parts and lower parts in the pair of left and right support arm bodies 78 to reduce the weight of the support arm bodies 78.

The support panel 81 is provided across a pair of connecting members for connecting the lower parts of the left and right support arm bodies 78 to each other, and three article positioning members 53 having the same triangular shape as the loading panel 50 are provided to the support panel 81.

The left and right holding guided members 80 are each composed of a pair of front and rear guided rollers, are configured to roll with respect to the fixed-frame rails 76, and are guided and supported by the fixed frame 71 in a rear-tilted orientation in which the rear ends are positioned lower than the front ends. In other words, the left and right holding guided members 80 are each guided and supported by the fixed frame 71 so that the rear guided rollers are positioned lower than the front guided rollers even when the loading surface of the support panel 81 is horizontally oriented.

The holding link mechanism 74 is provided with a first link that swings about the same vertical axis as the holding operated body 73; a second link in which one end part is pivotally connected to the distal end part of the first link; a third link for swinging about the vertical axis of the proximal end at which the other end of the second link is pivotally connected to the middle part; and a fourth link whose proximal end is pivotally connected to the third link, and in which a pivot support 86a pivotally connected to the rear end part of the support arm bodies 78 is provided to the distal end part.

In other words, in the holding link mechanism 74, when the holding operated body 73 is operated counter-clockwise as viewed in a plane from the adjacent position to the spaced position, the first link and the third link each swing counter-clockwise, and the pivot support 86a moves forward, whereby the support panel 81 is moved from the article holding position to the article receiving position. When the holding operated body 73 is operated clockwise as viewed in a plane from the spaced position to the adjacent position, the first link and the third link each swing clockwise, and the pivot support 86a moves toward the rear, whereby the support panel 81 is moved from the article receiving position to the article holding position.

[Other Embodiments]

(1) A configuration is adopted in the embodiment described above in which the fixed-frame rails 76 for guiding and supporting the support panel 81 in the projection and retraction movement direction of the support panel 81 are provided in a location corresponding to the article holding position, the support panel 81 is guided and supported by the fixed-frame rails 76 so as to be able to project and retract in the projection and retraction movement direction thereof, and the fixed-frame rails 76 only are provided as guides. However, as shown in FIGS. 13 and 14, a configuration may also be adopted in which the fixed-frame rails 76 for guiding and supporting a guide rail 87 in the projection and retraction movement direction of the support panel 81 are provided in a location corresponding to the article holding position, the support panel 81 is guided and supported by the guide rail 87 so as to be able to project and retract in the projection and retraction movement direction thereof, and the fixed-frame rails 76 and the guide rail 87 are provided as guides.

Figure 13:
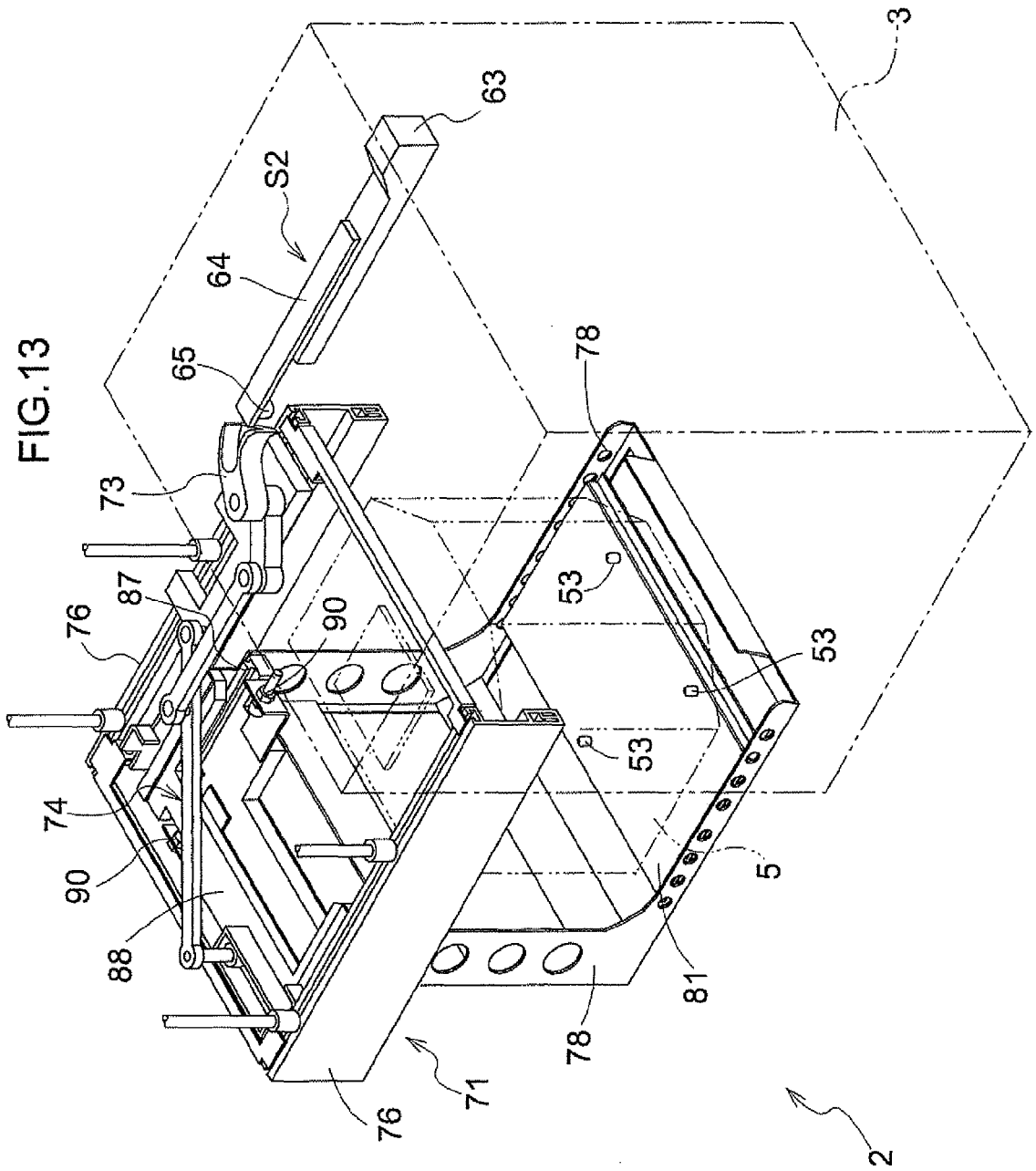
FIG. 13 is a perspective view showing the support panel of the article holding position in another embodiment.

As shown in FIGS. 13 and 14, a configuration is adopted in the present embodiment in which the guide rail 87 and a pair of left and right holding guided members 89 directly guided by the left and right fixed-frame rails 76 are provided to a rack supporting frame 88 that is provided in a location that corresponds to the article holding position, and a storing guide member (not shown) supported by the support arm bodies 78 is guided by the guide rail 87. A movement restriction member 90 for restricting the movement of the support arm bodies 78 in the front and back direction of the rack to within a set movement range is provided to the rack supporting frame 88, and the movement restriction member 90 is composed of a retraction movement restricting member 90 for restricting the rearward movement of the support arm bodies 78 in relation to the rack supporting frame 88 to within the set movement range, and a projection movement restricting member 90 for restricting the forward movement of the support arm bodies 78 in relation to the rack supporting frame 88 to within the set movement range.

The fixed-frame rails 76 correspond to the fixed guide, and the rack supporting frame 88 corresponds to the movable guide for rack support.

Appropriate modification to a rolling system, a sliding system, or the like may be made to each of the guide structure for the movable guiding rails 46 of the main guide rails 40, the guide structure for the loading panel 50 of the movable guiding rails 46, the guide structure for the support panel 81 of the fixed-frame rails 76, the guide structure for the guide rail 87 of the fixed-frame rails 76, and the guide structure for the support panel 81 of the guide rail 87. For example, the guide structure for the movable guiding rails 46 of the main guide rails 40 may be configured as a sliding system in the manner of the guide structure for the loading panel 50 of the movable guiding rails 46, and the guide structure for the loading panel 50 of the movable guiding rails 46 may be configured as a rolling system in the manner of the guide structure for the movable guiding rails 46 of the main guide rails 40.

Besides the configuration in which a wheel body is rolled in the internal space of rails that are horseshoe-shaped as viewed in the front and back direction, a configuration may be adopted for a rolling-type guide structure in which a plurality of wheel bodies allocated vertically to the upper surfaces and the lower surfaces of rod-shaped rails is rolled.

(2) A configuration is adopted in the embodiment described above in which the main guide rails 40 for guiding and supporting the movable guiding rails 46 so as to be able to move in the projection and retraction movement direction of the loading panel 50 are provided to the article storage rack 1, the loading panel 50 is configured to be guided and supported on the movable guiding rails 46 so as to be able to move in the projection and retraction movement direction, and the main guide rails 40 and the movable guiding rails 46 are provided as guides. However, a configuration may also be adopted in which the main guide rails 40 for guiding and supporting the loading panel 50 so as to be able to move in the projection and retraction direction of the loading panel 50 are provided to the article storage rack 1, the loading panel 50 is guided and supported on the main guide rails 40 so as to be able to move in the projection and retraction direction, and only the main guide rails 40 are provided as guides.

(3) In the embodiment described above, the article storage rack 1, the holding rack 2 (support panel 81), and the article transporter 3 are provided in a downflow-type clean space in which clean air is made to flow downward. However, the article storage rack 1, the article holding rack 2, and the article transporter 3 may also be disposed in a simplified cloth-lined clean space that is not of the downflow type, or in a non-clean space.

(4) In the embodiment described above, the article holding rack operating means S2 for projecting and retracting the support panel 81 to the article receiving position and the article holding position is provided to the article transporter 3, but the article holding rack operating means S2 for projecting and retracting the support panel 81 to the article receiving position and the article holding position may also be provided so as to correspond to the article holding position of the support panel 81, e.g., an electric motor supported by the fixed frame 71 may be provided as the article holding rack operating means S2.

(5) In the embodiment described above, the support panel 81 is provided in a location that faces the loading panel 50 and is spaced apart from the article storage rack 1 in the projection direction of the loading panel 50. However, the support panel 81 need not be provided, or another article storage rack 1 may be also provided in a location that faces the loading panel 50 and is spaced apart from the article storage rack 1 in the projection direction of the loading panel 50.

(6) In the embodiment described above, the example of a linear motor system is described as the system for driving the upper car body 9 in which an propelling force is obtained by a linear motor for driving. However, a system may be used in which the travel wheels 15 are provided with an electric motor for rotational driving, and the upper car body 9 is driven by rotatably driving the travel wheels 15 using the electric motor, for example.

(7) In the embodiment described above, a configuration is adopted in which the wires 6 are wound on the rotating drum 26, and the article holder 23 is raised and lowered, but a configuration may also be adopted in which belts are wound on the rotating drum 26, and the article holder 23 is raised and lowered, for example. The belts or wires are referred to as flexible members.

What is claimed is:

1. An article storage facility comprising:
    an article storage rack in which a plurality of article storage units for storing articles is provided so as to be arranged in a horizontal direction and a vertical direction;
    an article transporter configured to move along a path via an article transfer location for said article storage rack; and
    an article loader for bringing articles into and taking articles out of said article storage rack, said article loader is supported by said article storage rack so as to be able to project and retract between a protruding position for article transfer that projects to an outside of said article storage rack, and a retracted position for retracting toward said article storage rack, wherein said article transporter is configured to deliver an article to or receive an article from said article loader in said protruding position when said article transporter is at said article transfer location; and
    protrusion and retraction operating means provided to said article transporter for operating said article loader between said protruding position and said retracted position when said article transporter is at said article transfer location,
    wherein said article transporter is configured to move along a path that is above said article loader, and an article holder is provided that is configured to move vertically in order to deliver an article to and receive an article from said article loader,
    wherein said article loader is configured to move the article supported thereon to inside of said article storage rack when said article loader retracts to said retracted position and to outside of said article storage rack when said article loader projects to said protruding position,
    wherein said article loader is operatively connected by a link mechanism to an operated body that is directly operated by a protruding and retracting operation of said protrusion and retraction operating means, and
    wherein said protrusion and retraction operating means is configured to project with respect to said article transporter to cause said article loader to project from said retracted position to said protruding position and to retract with respect to said article transporter to cause said article loader to retract from said protruding position to said retracted position.

2. The article storage facility according to claim 1, wherein a main guide for guiding and supporting a movable guide is provided to said article storage rack so as to allow said movable guide to move in a protrusion and retraction movement direction of said article loader with respect to said main guide, wherein said article loader is guided and supported by said movable guide so as to allow said article loader to move in the protrusion and retract direction with respect to said movable guide.

3. The article storage facility according to claim 1, further comprising:
    an article transfer device located in association with said article storage rack and configured to move horizontally and vertically to transport an article between said article storage units and said article loader in said retracted position.

4. The article storage facility according to claim 1, wherein said article storage rack and said article transporter are disposed within a downflow-type clean space.

5. The article storage facility according to claim 1, further comprising:
    an article holding rack that is provided in a location opposite said article loader and at a distance in a protrusion direction of said article loader with respect to said article storage rack, and is configured to move to an article receipt position that is projected towards said article storage rack, and to an article holding position that is retracted away from said article storage rack; wherein said article transporter is configured to deliver an article to and receive an article from said article holding rack in said article receipt position when said article transporter is at said article transfer location.

6. The article storage facility according to claim 5, further comprising:

article holding rack operating means provided to said article transporter and configured to cause said article holding rack to protrude to said article receipt position and retract to said article holding position when said article transporter is at said article transfer location.

7. The article storage facility according to claim 5, further comprising:
a fixed guide provided to correspond to an article holding position of said article holding rack, for guiding and supporting a movable guide for rack support in a protrusion and retraction direction of said article holding rack; wherein
said article holding rack is guided and supported by said movable guide for rack support so as to allow said article holding rack to project and retract in the protrusion and retraction movement direction.

8. The article storage facility according to claim 1, wherein said protrusion and retraction operating means has an operating body;
said operating body is configured to move said operated body provided to said article storage rack;
said link mechanism includes a vertically extending link; and
movement of said operated body is transmitted as drive force for driving said article loader between said protruding position and said retracted position via said vertically extending link.

9. The article storage facility according to claim 1, wherein said article loader in said protruding position overlaps with said article transporter.

10. An article storage facility comprising:
an article storage rack in which a plurality of article storage units for storing articles is provided in horizontal and vertical rows;
an article loader supported by said article storage rack and configured to move between a protruding position, for receiving an article, that is projected from said article storage rack, and a retracted position that is retracted toward said article storage rack;
a vehicle configured to move along a rail that extends in a vicinity of said article storage rack and that is suspended from a ceiling;
a drum supported by said vehicle for winding a flexible member;
a motor for rotating said drum;
an article holder suspended to be movable in a vertical direction with respect to said vehicle via said flexible member, wherein said article loader and said rail are so positioned as to allow an article to be transferred between said article holder and said article loader in said protruding position when said vehicle is at a position corresponding to said article loader; and
an operating body supported by said vehicle, for transmitting a drive force for moving said article loader from said retracted position to said protruding position,
wherein said vehicle is configured to move along a path that is above said article loader, and an article holder is provided that is configured to move vertically in order to deliver an article to and receive an article from said article loader,
wherein said article loader is configured to move the article supported thereon to inside of said article storage rack when said article loader retracts to said retracted position and to outside of said article storage rack when said article loader projects to said protruding position,
wherein said article loader is operatively connected by a link mechanism to an operated body that is directly operated by a protruding and retracting operation of said operating body, and
wherein said operating body is configured to project with respect to said vehicle to cause said article loader to project from said retracted position to said protruding position and to retract with respect to said vehicle to cause said article loader to retract from said protruding position to said retracted position.

11. The article storage facility according to claim 10, wherein
a main guide for guiding and supporting a movable guide is provided to said article storage rack so as to allow said movable guide to move in a protrusion and retraction movement direction of said article loader with respect to said main guide, wherein said article loader is guided and supported by said movable guide so as to allow said article loader to move in the protrusion and retract direction with respect to said movable guide.

12. The article storage facility according to claim 10, further comprising:
a stocker crane that is disposed on an opposite side from said article storage rack with respect to said vehicle when said vehicle is disposed in a position corresponding to said article loader, wherein the stocker crane has a transfer member configured to transfer an article with said article loader in said retracted position.

13. The article storage facility according to claim 10, wherein
said article storage rack and said vehicle are disposed within a downflow-type clean space.

14. The article storage facility according to claim 10, further comprising:
an article holding rack that is provided in a location opposite said article loader and at a distance in a protrusion direction of said article loader with respect to said article storage rack, and is configured to move to an article receipt position that is projected towards said article storage rack, and to an article holding position that is retracted away from said article storage rack; wherein
said article holder is configured to deliver an article to and receive an article from said article holding rack in said article receipt position.

15. The article storage facility according to claim 14, further comprising:
an operating body provided to said vehicle, for transmitting a drive force for moving said article holding rack from said article holding position to said article receipt position.

16. The article storage facility according to claim 14, further comprising:
a fixed guide provided to correspond to an article holding position of said article holding rack, for guiding and supporting a movable guide for rack support in a protrusion and retraction direction of said article holding rack; wherein
said article holding rack is guided and supported by said movable guide for rack support so as to allow said article holding rack to project and retract in the protrusion and retraction movement direction.

17. The article storage facility according to claim 10, wherein
said article loader is gravitationally urged toward said retracted position.

18. The article storage facility according to claim 10, wherein said article loader in said protruding position overlaps with said vehicle.

19. An article storage facility comprising:
an article storage rack in which a plurality of article storage units for storing articles is provided so as to be arranged in a horizontal direction and a vertical direction;
an article transporter configured to move along a path via an article transfer location for said article storage rack; and
an article loader for bringing articles into and taking articles out of said article storage rack, said article loader being provided to said article storage rack so as to be able to project and retract between a protruding position for article transfer that projects to an outside of said article storage rack, and a retracted position for retracting toward said article storage rack, wherein said article transporter is configured to deliver an article to or receive an article from said article loader in said protruding position when said article transporter is at said article transfer location; and
protrusion and retraction operating means provided to said article transporter for operating said article loader between said protruding position and said retracted position when said article transporter is at said article transfer location,
wherein
said protrusion and retraction operating means has an operating body;
said operating body is configured to move an operated body provided to said article storage rack; and
movement of said operated body is transmitted as drive force for driving said article loader between said protruding position and said retracted position via a link that extends vertically.

20. An article storage facility comprising:
an article storage rack in which a plurality of article storage units for storing articles is provided in horizontal and vertical rows;
an article loader supported by said article storage rack and configured to move between a protruding position, for receiving an article, that is projected from said article storage rack, and a retracted position that is retracted toward said article storage rack;
a vehicle configured to move along a rail that extends in a vicinity of said article storage rack and that is suspended from a ceiling;
a drum supported by said vehicle for winding a flexible member;
a motor for rotating said drum;
an article holder suspended to be movable in a vertical direction with respect to said vehicle via said flexible member, wherein said article loader and said rail are so positioned as to allow an article to be transferred between said article holder and said article loader in said protruding position when said vehicle is at a position corresponding to said article loader;
an operating body supported by said vehicle, for transmitting a drive force for moving said article loader from said retracted position to said protruding position; and
a stocker crane that is disposed on an opposite side from said article storage rack with respect to said vehicle when said vehicle is disposed in a position corresponding to said article loader, wherein the stocker crane has a transfer member configured to transfer an article with said article loader in said retracted position.

* * * * *